United States Patent [19]

Thomas et al.

[11] Patent Number: 4,686,763
[45] Date of Patent: Aug. 18, 1987

[54] METHOD OF MAKING A PLANAR POLYSILICON BIPOLAR DEVICE

[75] Inventors: Mammen Thomas, San Jose; Matthew Weinberg, Mountain View, both of Calif.

[73] Assignee: Advanced Micro Devices, Inc., Sunnyvale, Calif.

[21] Appl. No.: 782,838

[22] Filed: Oct. 2, 1985

[51] Int. Cl.$^4$ .................. H01L 21/08; H01L 21/302; H01L 21/461

[52] U.S. Cl. ........................................ 437/51; 357/34; 357/59; 357/60; 437/201; 437/160

[58] Field of Search .............. 29/576 C, 576 T, 578, 29/580; 148/1.5, 188, DIG. 11, 3, 51, 86, 90, 122, 131; 156/644, 662; 357/34, 59, 60

[56] References Cited

U.S. PATENT DOCUMENTS

| 4,259,680 | 3/1981 | Lepselter et al. | 357/35 |
| 4,319,954 | 3/1982 | White et al. | 156/628 |
| 4,445,268 | 5/1984 | Hirao | 29/571 |
| 4,542,580 | 9/1985 | Delivorias | 29/590 |

FOREIGN PATENT DOCUMENTS 2148593  5/1985  United Kingdom ............ 21/76

Primary Examiner—Brian E. Hearn
Assistant Examiner—William Bunch
Attorney, Agent, or Firm—Patrick T. King; John P. Taylor

[57] ABSTRACT

A highly planarized integrated circuit structure having at least one bipolar device is described as well as a method of making the structure. The structure comprises a substrate having a field oxide grown thereon with openings defined therein respectively for formation of a collector contact region and a base/emitter region for a bipolar device in the substrate. All of the contacts of the bipolar device are formed using polysilicon which fills the defined openings in the field oxide resulting in a highly planarized structure.

17 Claims, 15 Drawing Figures

METHOD OF MAKING A PLANAR POLYSILICON BIPOLAR DEVICE

BACKGROUND OF THE INvENTION

1. Field of the Invention

This invention relates to integrated circuit structures. More particularly, this invention relates to an improved integrated circuit structure containing a bipolar device and a method of constructing the structure.

2. Description of the Prior Art

Bipolar devices are preferred over MOS devices in some instances due to their high current carrying characteristics and superior transconductance. However, the use of an extrinsic base to provide interconnection between the intrinsic base and the base contact conventionally adds undesirable resistance as well as additional capacitance to the device which degrades performance. Furthermore, the construction of bipolar devices on a substrate can also result in the creation of undesirable steps resulting in the need for further planarization.

It would, therefore, be very desirable to be able to construct bipolar devices in a manner which would address the problems discussed above including the construction of a planarized integrated circuit structure incorporating such devices therein.

SUMMARY OF THE INVENTION

It is, therefore, an object of this invention to provide an improved integrated circuit structure containing one or more bipolar devices therein.

It is another object of this invention to provide an improved integrated circuit structure containing one or more bipolar devices therein characterized by low capacitance between the elements of the device to thereby improve performance.

It is yet another object of this invention to provide an improved integrated circuit structure containing one or more bipolar devices therein which is further characterized by a highly planarized structure.

It is a further object of this invention to provide an improved integrated circuit structure containing one or more bipolar devices therein having self aligned contacts to reduce misalignment of contacts and reduce the contact area.

It is yet a further object of this invention to provide a method for efficiently constructing such an improved integrated circuit structure containing one or more bipolar devices therein.

These and other objects of the invention will be apparent from the following description and accompanying drawings.

In accordance with the invention a highly planarized integrated circuit structure having at least one bipolar device therein comprises a substrate having a field oxide grown thereon with portions defined therein respectively for formation of a collector region and a base/emitter region for a bipolar device. All of the elements of the device are formed using polysilicon which fills the defined portions in the field oxide resulting in the highly planarized structure.

DESCRIPTION OF THE PREFERRED EMBODIMENTS

The invention provides for the construction of a highly planarized integrated circuit structure containing one or more bipolar devices.

Figure 1:
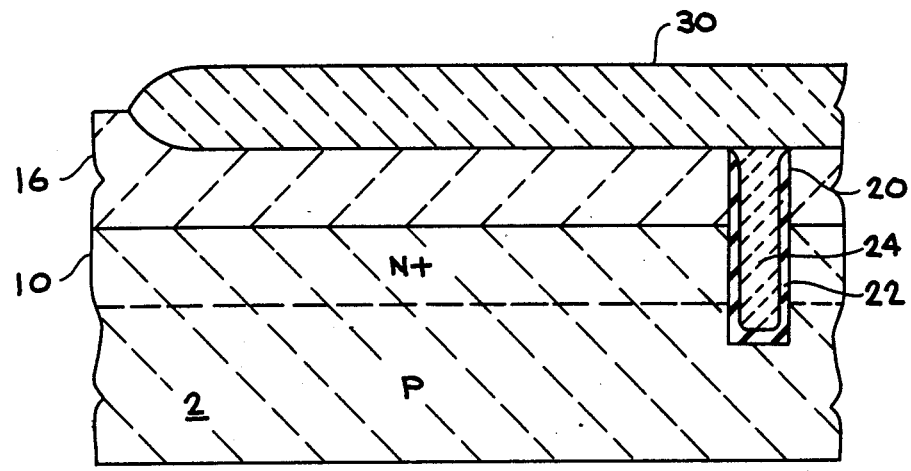
FIG. 1 is a fragmentary vertical cross-sectional view illustrating an early step in the construction of an embodiment of the invention.

Referring to FIG. 1, a buried N+ layer 10 is conventionally formed in a P type silicon substrate 2 to provide the buried collector for the bipolar transistor. A layer 16 of epitaxial silicon is then grown over buried layer 10.

As further shown in FIG. 1, an isolation slot 20 may then be cut through epitaxial layer 16 and buried layer 10 and partially into substrate 2 to provide isolation between the bipolar device and any other devices which may be formed in the same substrate. A 2000 Angstrom layer of isolation oxide 22 may be grown in slot 20 after which slot 20 may be filled with polysilicon 24. A layer of field oxide 30 is then grown over epitaxial layer 16, including slot 20, at least in the region where the active devices will be formed.

It should be noted here, that while a slot type of isolation is illustrated here, other forms of isolation such as isoplanar or junction isolation may also be used in connection with the practice of this invention.

Figure 2:
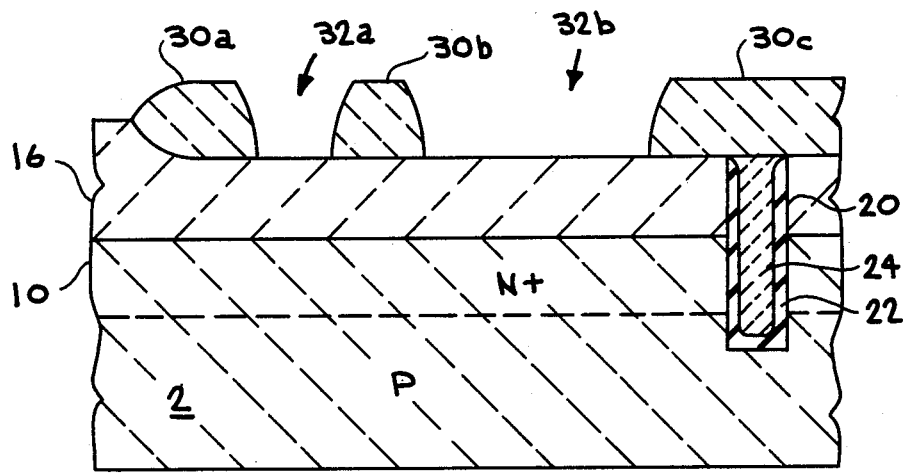
FIGS. 2–11 are fragmentary vertical cross-sectional views of subsequent steps in the construction of the embodiment of FIG. 1.

After growth or deposition of field oxide layer 30, the structure is masked and etched, as shown in FIG. 2, to define, in field oxide layer 30, a collector contact region 32a, and a base/emitter region 32b leaving the remaining portions 30a, 30b, and 30c of field oxide layer 30 bounding these regions.

Figure 3:
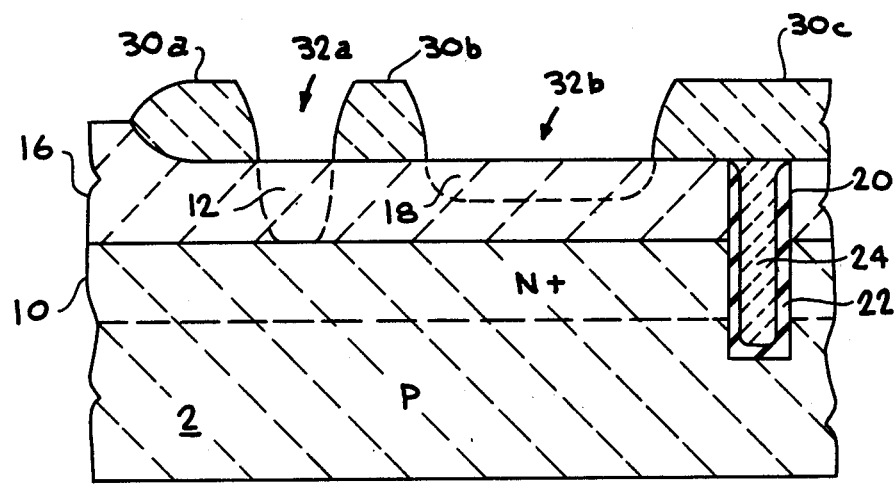

Collector region 32a is then masked to permit implantation of a P base 18 into substrate 16 for the bipolar transistor. Following this, base/emitter region 32b is masked and an N+ implantation is made through collector opening 32a into epi layer 16 to form sinker 12 to provide communication with buried layer 10. The resulting structure is shown in FIG. 3.

Figure 4:
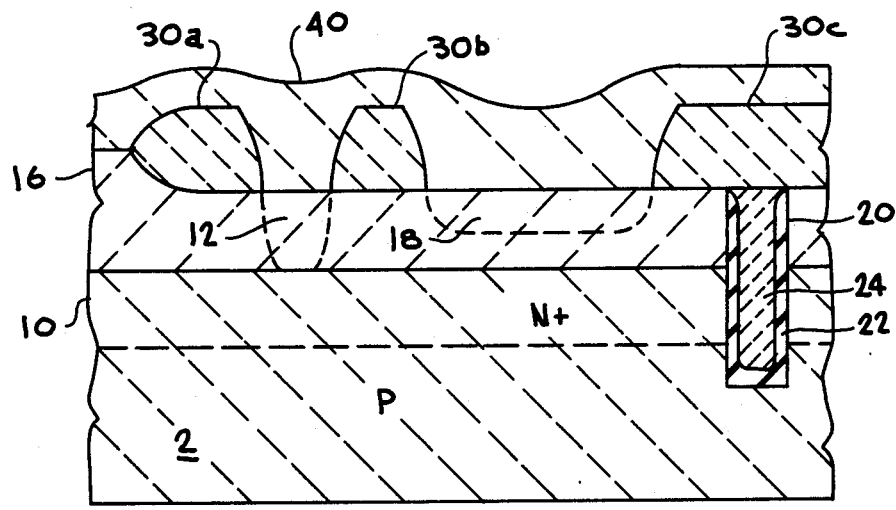
Figure 5:
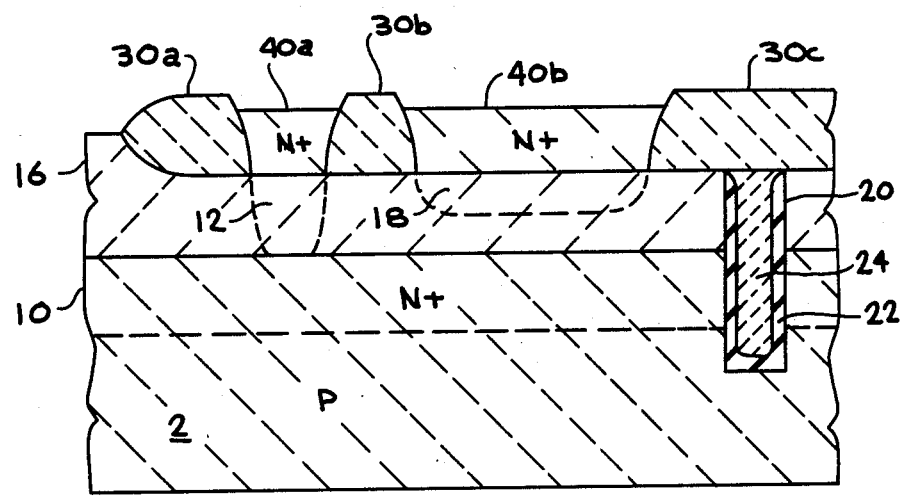

As shown in FIGS. 4 and 5, a layer 40 of polysilicon is now applied, planarized by polishing or etching back to the level of oxide segments 30a–30c, and then further etched down about 2000 Angstroms below the oxide surface. The polysilicon is then given an N+ implant as shown in FIG. 5.

Figure 6:
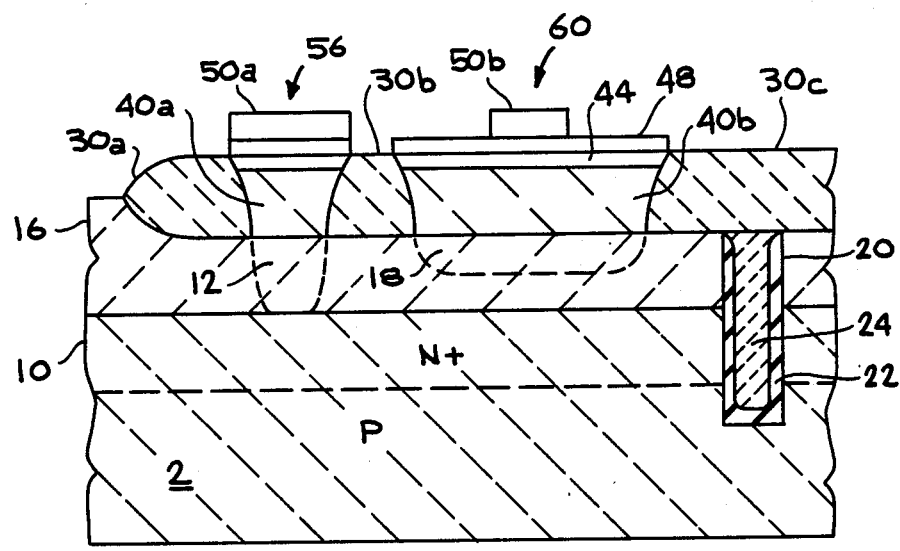
Figure 7:
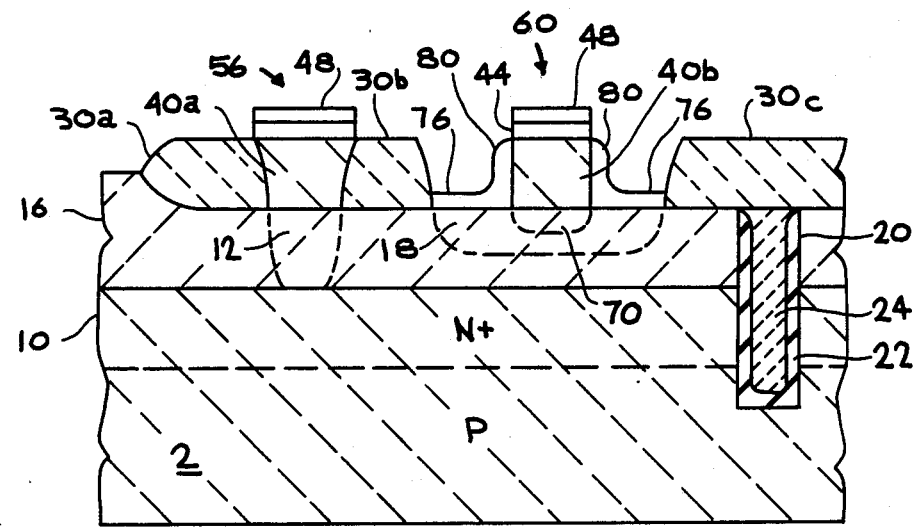

A masking layer of nitride 44 is applied over the remaining portions 40a and 40b of polysilicon layer 40 and an oxide layer 48 is formed over nitride layer 44. It should be noted at this point that the provision of oxide mask portion 48 over nitride mask 44 permits subsequent planarization to be performed since the oxide 48 serves to prevent the underlying nitride mask 44 from being polished away. The oxide/nitride layers are then masked at 50a and 50b in FIG. 6 conforming, respectively, to a collector contact portion generally indicated at 56 and an emitter contact portion generally indicated at 60. The remainder of the oxide/nitride mask is then removed as well as the underlying polysilicon down to epitaxial layer 16 leaving polysilicon portions 40a and 40b conforming to the respective collector contact and emitter portions. As shown in FIG. 7, thermal oxide may now be grown over the exposed epitaxial silicon and polysilicon by heating the structure to about 900° C. for about 20 to 30 minutes. This also permits diffusion from polysilicon emitter contact portion 40b into epitaxial layer 16 to form emitter 70. The oxide grows on the epi layer at 76 at a slower rate than the oxide 80 on the highly doped polysilicon emitter contact portion 40b. Oxide 76 is allowed to reach a thickness of about 1500 Angstroms which results in a growth of about 4000 Angstroms for the oxide 80 on the sidewalls of polysilicon emitter contact portion 40b.

Figure 8:
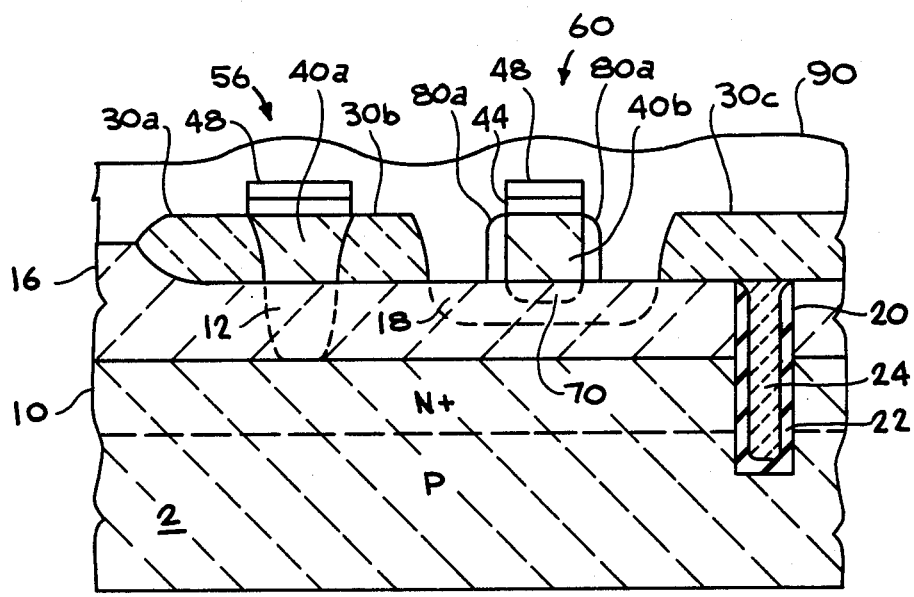

The structure is now exposed to a reactive ion etch (RIE) to remove the oxide portions 76 over the epi layer 16 leaving oxide spacers 80a on the polysilicon sidewalls of emitter contact portion 40b as seen in FIG. 8.

Alternatively, low pressure chemical vapor deposited glass (LPCVD glass) may be deposited over the exposed epitaxial silicon and polysilicon in which case emitter region 70 may be formed by a short drive in an inert ambient, e.g., 1000° C. for 10 minutes in a nitrogen atmosphere. The glass is then selectively removed to leave only the oxide spacers 80a, again using an RIE to remove the remainder of the glass with the etch time adjusted accordingly.

Figure 9:
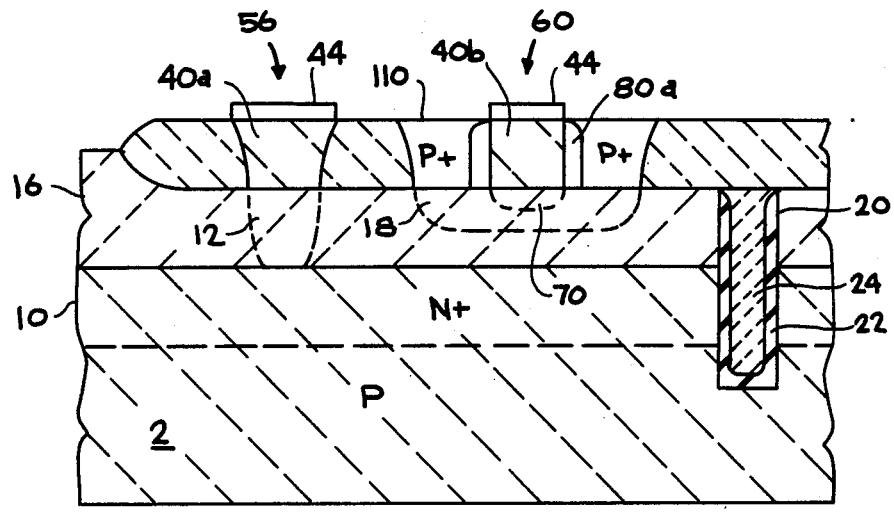
Figure 10:
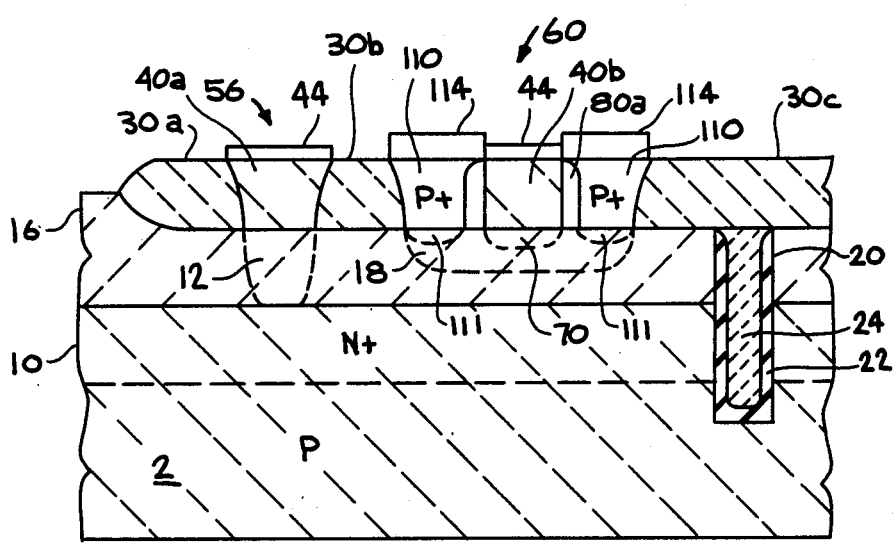

Another layer 90 of polysilicon is now applied over the structure (FIG. 8) and then planarized, either by etching or mechanical polishing, as shown in FIG. 9. A P+ implantation is then carried out to form base contact regions 110 as shown in FIG. 9.

After formation of the base contact region, the structure may be heated to a temperature of 900° C. for 20 to 30 minutes to form shallow extrinsic base regions 111, and at the same time to grow an oxide layer 114 over base contacts 110. Alternatively, the structure may be subject to a Rapid Thermal Anneal, e.g., about 6 seconds exposure to high energy, such as high intensity UV, to form the desired shallow junctions, followed by a very low temperature oxidation, i.e., about 750° to 850° C.

Figure 11:
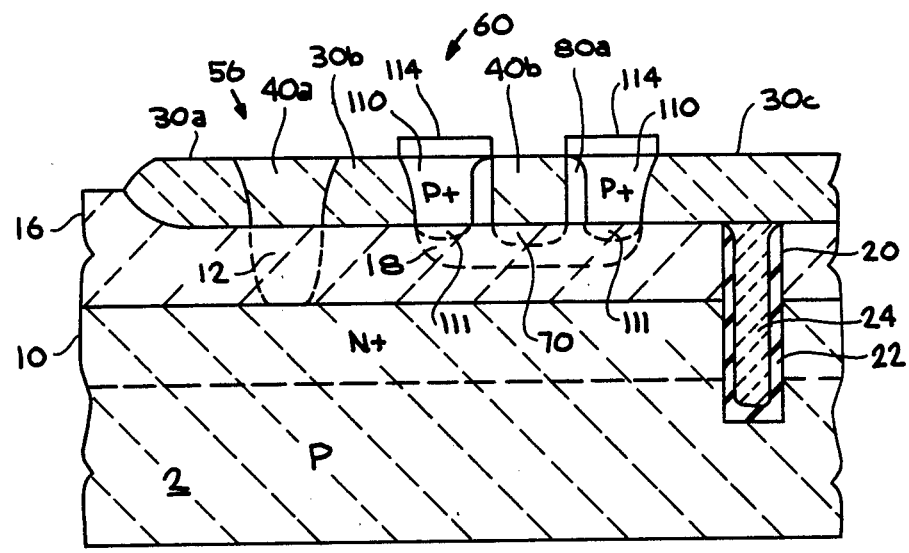
Figure 12:
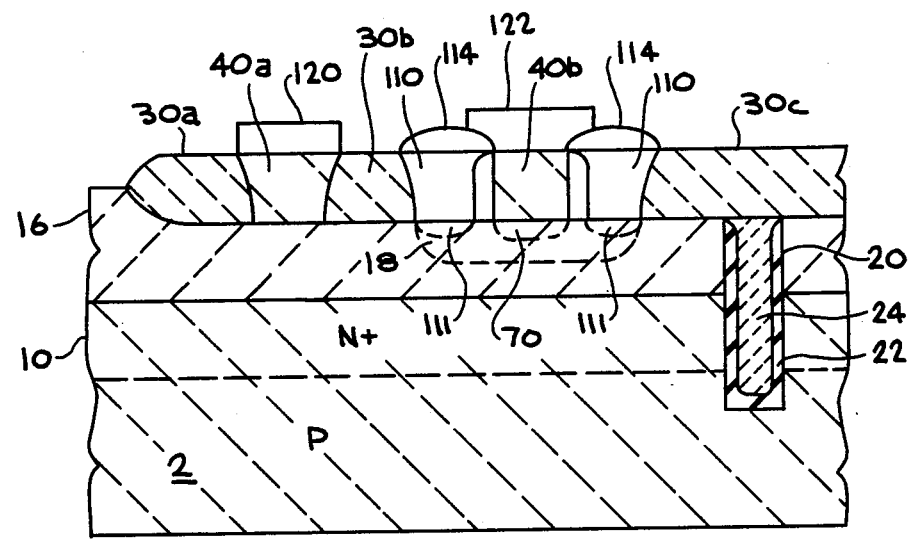
FIGS. 12 and 13 are fragmentary vertical cross-sectional views of the final processing steps in the construction of the embodiment of FIG. 1.

After the base implantation, and the oxidation step, nitride mask 44 is removed from the top of collector contact portion 40a and emitter contact portion 40b, as shown in FIG. 11. A collector mask 120 is then applied over collector contact 40a and an oversized emitter mask 122 is applied over emitter contact 40b. It will be noted in FIG. 12 that oversized emitter mask 122 overlaps a portion of adjoining oxide 114.

Figure 13:
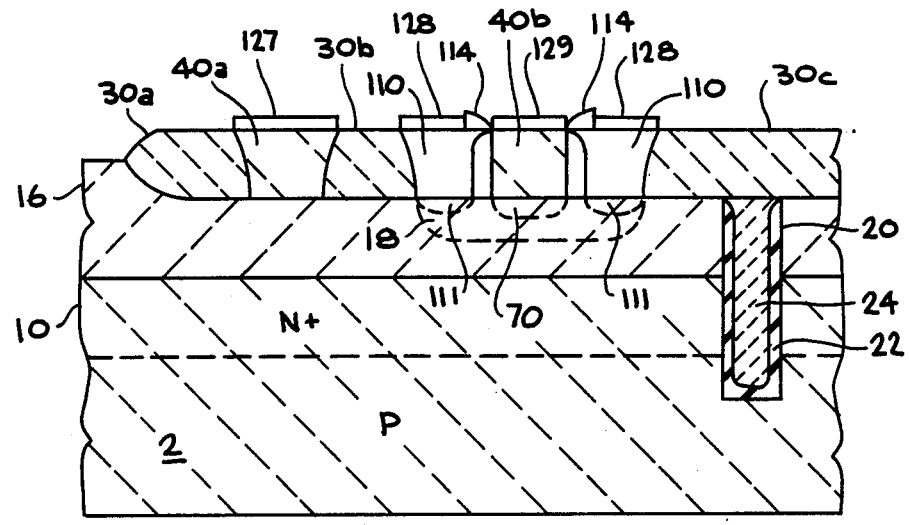

The remaining, exposed oxide portions 114, are now removed by etching or the like. Masks 120 and 122 are also removed and a metal capable of forming a silicide with the now exposed polysilicon, e.g., titanium or platinum, is applied. The structure is heated to a temperature of about 500° C. for about 15 to 30 minutes to permit the metal to react with the polysilicon to form the corresponding collector silicide contact portion 127, base silicide contact portions 128, and emitter silicide contact portion 129 as shown in FIG. 13.

Figure 14:
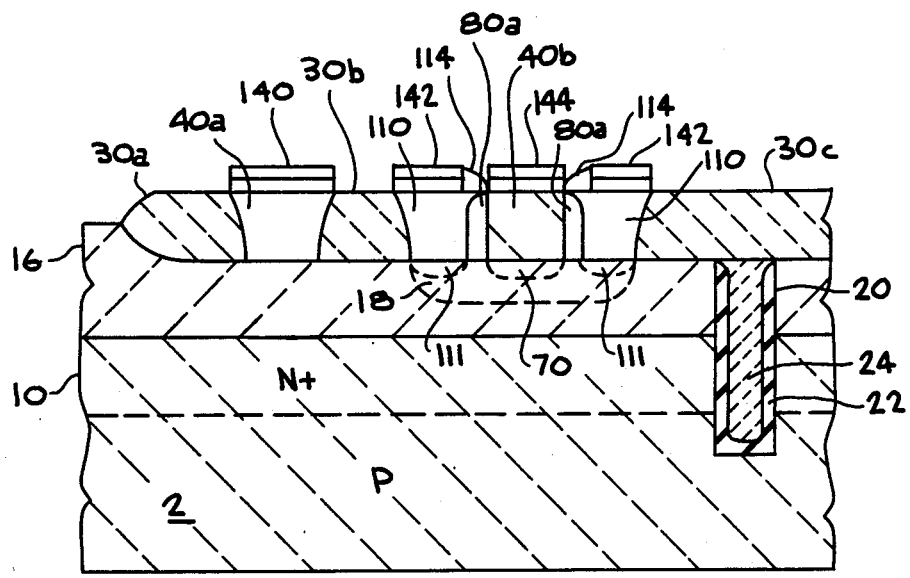
FIG. 14 is a fragmentary vertical cross-sectional view of the completed structure of the invention.
Figure 15:
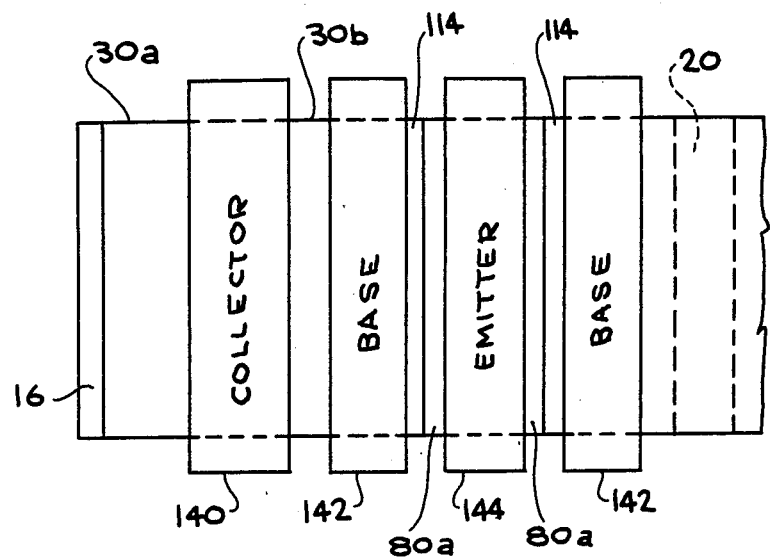
FIG. 15 is a top view of the completed structure of the invention shown in FIG. 14.

The surface is coated with a conductor such as, for example, a 0.8 micron layer of aluminum over a barrier metal such as TiW. The metal conductor is then masked and selectively etched using conventional techniques to form collector contact strip 140, base contact strips 142, and emitter contact strip 144 as shown in FIGS. 14 and 15.

The result is a highly planarized integrated structure containing a bipolar device with raised polysilicon contacts which results in the contacts being substantially at the same level as the adjoining field oxide which imparts the high degree of planarization which characterizes this invention. Because of the use of polysilicon base contacts, the bipolar device may be provided with a very shallow extrinsic base.

Furthermore, the presence of the oxide spacers adjacent the raised polysilicon emitter reduces the path in the extrinsic base from the emitter to the base polysilicon contact. This reduces resistance as well as capacitance thus enhancing the performance of the device. The use of a polysilicon emitter in the bipolar device also raises the gain of the device.

Finally, the use of self-aligned contacts and a highly planarized construction design produces a compact structure with the contacts spaced close together and permits reduction of the contact size resulting in higher density.

Having thus described the invention, what is claimed is:

1. A method of forming a highly planarized integrated circuit structure containing one or more bipolar devices which comprises:
   (a) forming a buried layer in at least a portion of a substrate parallel to a first surface thereon;
   (b) forming an oxide layer on said first surface of said substrate;
   (c) removing selective portions of said oxide layer to form openings therein extending to said first surface of said substrate;
   (d) forming portions of said one or more bipolar devices in said openings using a doped polysilicon deposited over said structure and then planarized to provide polysilicon in said openings to a level approximately equal to the top of said oxide layer to thereby form a highly planarized surface on said integrated circuit structure.

2. The method of claim 1 including the further step of selectively removing portions of said doped polysilicon deposited in said openings in said oxide layer to form an emitter contact portion.

3. The method of claim 2 including the further steps of applying one or more masking layers over said doped polysilicon prior to said selective removal of polysilicon.

4. The method of claim 3 wherein said step of selective removal of said polysilicon to form an emitter contact portion results in the formation of raised portions of polysilicon on said substrate surface.

5. The method of claim 4 including the further step of forming oxide spacer members on the sidewalls of said raised polysilicon emitter contact portion.

6. The method of claim 5 wherein said step of forming said oxide spacers on the sidewalls of said polysilicon emitter contact portion comprises filling with oxide the openings left by said selective removal of polysilicon and then selectively removing a portion of said oxide.

7. The method of claim 15 including the further step of removing said portions of said oxide with a reactive ion etch.

8. The method of claim 7 including the further steps of applying another layer of polysilicon over said structure and then planarizing the structure to thereby fill with polysilicon the openings left by said selective removal of said oxide.

9. The method of claim 8 including the further step of doping said polysilicon used to fill said openings formed by said selective removal of oxide to thereby respectively form base contact portions adjacent said oxide spacers on said raised emitter contact portion.

10. The method of claim 9 including the further steps of forming a protective oxide layer over said base contacts and forming a base region in said epitaxial layer beneath the base contacts.

11. The method of claim 10 wherein said structure is heated to a temperature of about 900° C. for about 20 to 30 minutes to form said protective oxide and to diffuse said base contacts into said epitaxial layer to form said base region.

12. The method of claim 10 wherein said structure is subject to a rapid thermal anneal to form said base region in said epitaxial layer beneath said base contacts.

13. The method of claim 10 including the further steps of forming oversized masks over said collector and emitter contact regions, after formation of said base region, which will overlap a portion of said protective oxide over said base contact region; removing the remaining portions of said protective oxide; removing the oversized mask; and forming a metal silicide in the surface of the now exposed portions of said collector, emitter, and base contact regions to provide low resistance lateral current paths in said structure, and whereby said structure will be provided with self-aligned contacts.

14. The method of claim 13 including the further step forming conductive metal contacts over said structure in respective electrical contact with said collector, base, and emitter regions in said structure.

15. The method of claim 5 wherein said step of forming oxide spacer members on the sidewalls of said raised polysilicon emitter contact portion further includes the steps of heating the structure to a temperature sufficient to grow thermal oxide over said exposed epitaxial silicon and polysilicon and to diffuse dopant from said raised polysilicon emitter contact portion into said substrate to form an emitter therein; and then selectively removing the oxide from said epitaxial layer while leaving oxide on said raised polysilicon emitter contact portion sidewalls.

16. A method of forming a highly planarized integrated circuit structure containing one or more bipolar devices which comprises:
(a) forming a buried layer in at least a portion of a substrate parallel to a first surface thereon;
(b) forming an oxide layer on said first said first surface of said substrate;
(c) removing selective portions of said oxide layer to form openings therein extending to said first surface of said substrate;
(d) forming a polysilicon layer over said structure to fill said openings in said oxide layer;
(e) planarizing said polysilicon layer to a level at least equal to the top of said oxide layer; and
(f) doping said remaining polysilicon to form portions of said one or more bipolar devices.

17. A method of forming a highly planarized integrated circuit structure containing one or more bipolar devices which comprises:
(a) forming a buried layer in at least a portion of a substrate parallel to a first surface thereon;
(b) forming an oxide layer on said first said first surface of said substrate;
(c) removing selective portions of said oxide layer to form openings therein extending to said first surface of said substrate;
(d) forming a base region in said substrate;
(e) forming a doped polysilicon layer over said structure planarized to a level at least equal to the top of said oxide layer to fill said openings in said oxide layer;
(f) masking portions of said doped and planarized polysilicon to define collector and emitter contact portions;
(g) removing the remainder of said polysilicon to expose the sidewalls of said emitter contact and the substrate underlying said polysilicon;
(h) forming an oxide layer on said exposed polysilicon sidewalls and said substrate;
(i) selectively removing said oxide from said substrate while leaving oxide on said polysilicon sidewalls;
(j) forming a second doped layer of polysilicon on said substrate to form base contact portions;
(k) respectively forming emitter and extrinsic base regions in said substrate below said respective doped polysilicon contact portions;
(l) forming an insulating layer over at least a portion of said structure containing said base contacts; and
(m) forming metal contacts to said respective polysilicon base, emitter, and collector contacts.

* * * * *